United States Patent [19]
Mueller et al.

[11] Patent Number: 5,235,131
[45] Date of Patent: Aug. 10, 1993

[54] RF SHIELD FABRICATION METHOD

[75] Inventors: Gary E. Mueller, Elgin; Robert T. Hirsbrunner, Crystal Lake, both of Ill.

[73] Assignee: Motorola, Inc., Schaumburg, Ill.

[21] Appl. No.: 860,382

[22] Filed: Mar. 30, 1992

[51] Int. Cl.⁵ .................... H05K 9/00; H05K 1/18; H05K 3/30
[52] U.S. Cl. .................... 174/35 R; 29/832; 29/835; 29/846; 361/761; 361/818; 257/659
[58] Field of Search .............. 29/829, 831, 832, 835, 29/836, 837, 846, 848, 849; 257/659, 660; 361/395, 400, 401, 399, 415, 424; 174/35 R, 35 MS

[56] References Cited

U.S. PATENT DOCUMENTS 4,738,746 4/1988 Clariou .................... 156/631

Primary Examiner—Leo P. Picard
Assistant Examiner—Bot L. Ledynh
Attorney, Agent, or Firm—Timothy W. Markison; Steven G. Parmelee

[57] ABSTRACT

An RF conductive shield can be fabricated from, and adhered to, a nonconductive substrate in the following manner. The RF conductive shield is fabricated in a predetermined geometric shape on the nonconductive substrate. Once the RF conductive shield is fabricated, it is cut from the nonconductive substrate to produce a separate RF shield. Having a separate RF shield, it can be placed on the nonconductive substrate in a predetermined location and adhered thereto.

8 Claims, 4 Drawing Sheets

RF SHIELD FABRICATION METHOD

FIELD OF THE INVENTION

This invention relates generally to RF shields and in particular to fabricating an RF shield on a printed circuit (PC) board.

BACKGROUND OF THE INVENTION

As is known, radio frequency (RF) shields are used on PC boards. The RF shield provides shielding from electromagnetic interferences (EMI) that is generated by circuitry on the PC board as well as circuitry in surrounding areas of the circuit board. The RF shield must be composed of a conductive material and electrically coupled to a ground reference to provide adequate shielding.

Typically, RF shields are fabricated from aluminum or copper and manually placed and secured on a PC board. Metallic RF shields generally cannot be automatically placed because it is too heavy to be vacuum picked. In addition, metallic RF shields have to be hand soldered and require a substantial amount of time to heat to a temperature such that they can be reflowed soldered on to the PC board. Therefore, a need exists for an RF shield that can be vacuum picked and requires less time to heat for reflow soldering than metallic RF shields.

SUMMARY OF THE INVENTION

These needs and others are substantially met by the RF shield fabrication method disclosed herein. An RF shield can be fabricated and adhered to a nonconductive substrate in the following manner. An RF conductive shield is fabricated having a predetermined geometric shape on the nonconductive substrate. Once the RF conductive shield is fabricated, it is cut from the nonconductive substrate to produce a separate RF shield. The separate RF shield is then placed on the nonconductive substrate in a predetermined location and adhered thereto.

DESCRIPTION OF A PREFERRED EMBODIMENT

Generally, the present invention provides an improved shielding methodology that protects electronic PC board circuitry from electromagnetic interference (EMI). The EMI is typically in the radio frequency range which, if not controlled by shielding, can degrade performance of the circuitry. The present invention using excess material from the PC board substrate, that is laminated with a conductive material, as an RF shield. With such an RF shield, manufacturability is increased, inventor is reduced, and mechanical stresses which result from different temperature coefficients of metallic RF shields and PC boards is reduced.

Figure 1:
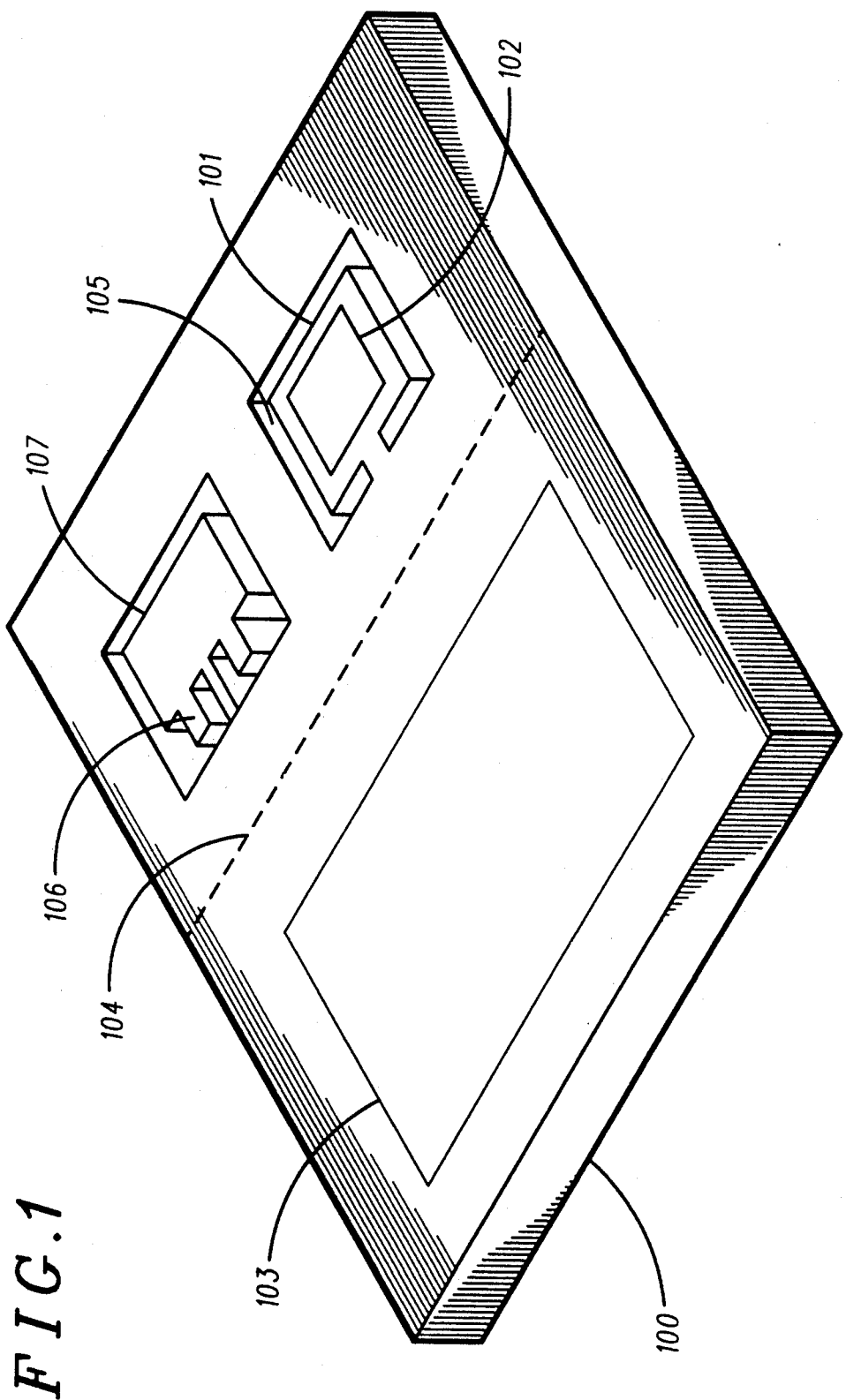
FIG. 1 illustrates a substrate that may incorporate the present invention.

The present invention can be more fully described with references to FIGS. 1-4. FIG. 1 illustrates a two RF shields 101 and 107 being fabricated on an electronic circuit board substrate 100. The substrate 100 comprises a component layout 103, a cutline 104 that separates the RF shield section from the component layout, a shield cutout 105 such that the RF shield can be easily removed from the substrate. Each of the RF shields 101 and 107 comprise a nonconductive material 102 which is laminated, or similarly adhered to, a conductive plating (not shown). The conductive plating is fabricated in the same manner as the component layout and is of the same conductive material such as copper traces. The plating of a conductive material onto a substrate to form a PC board is known, thus no further discussion will be presented. The nonconductive material 102 may be solder resist and is placed on at least one major surface of the respective RF shield. The second RF shield 107 further comprises tabs 106 that allow for perpendicular placement on the substrate (see FIG. 3).

The method of fabricating the RF shields 101 and 107 contemporaneously with the PC board consists of known PC board fabrication methods once the RF shields are delineated on the substrate. The geometric shape of the RF shields 101 and 107 is totally dependant on the application needed. The remaining FIGS. illustrate a small sample of the various shapes an RF shield fabricated in this manner could take.

Figure 2:
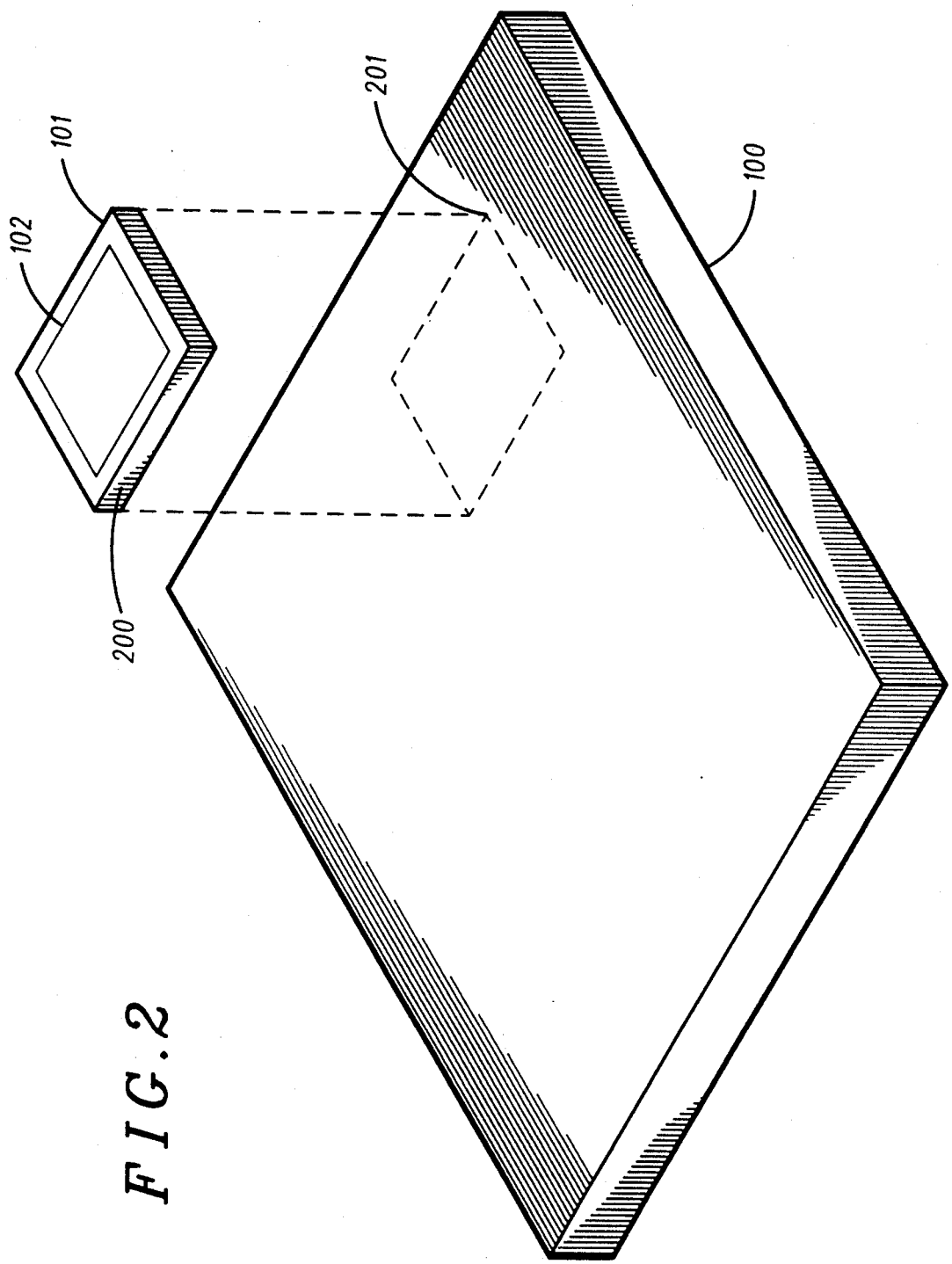
FIG. 2 illustrates placing an RF shield onto a substrate in a predetermined location.

FIG. 2 illustrates a parallel placement of RF shield 1 101 at a predetermined location 102. RF shield 1 101 is placed with the non conductive material 102 facing away from the substrate 102 with the edge plating 200 coming in contact with the substrate 100. Once in place, the RF shield can be adhered to the substrate in any known manner such as wave or reflow soldering.

Figure 3:
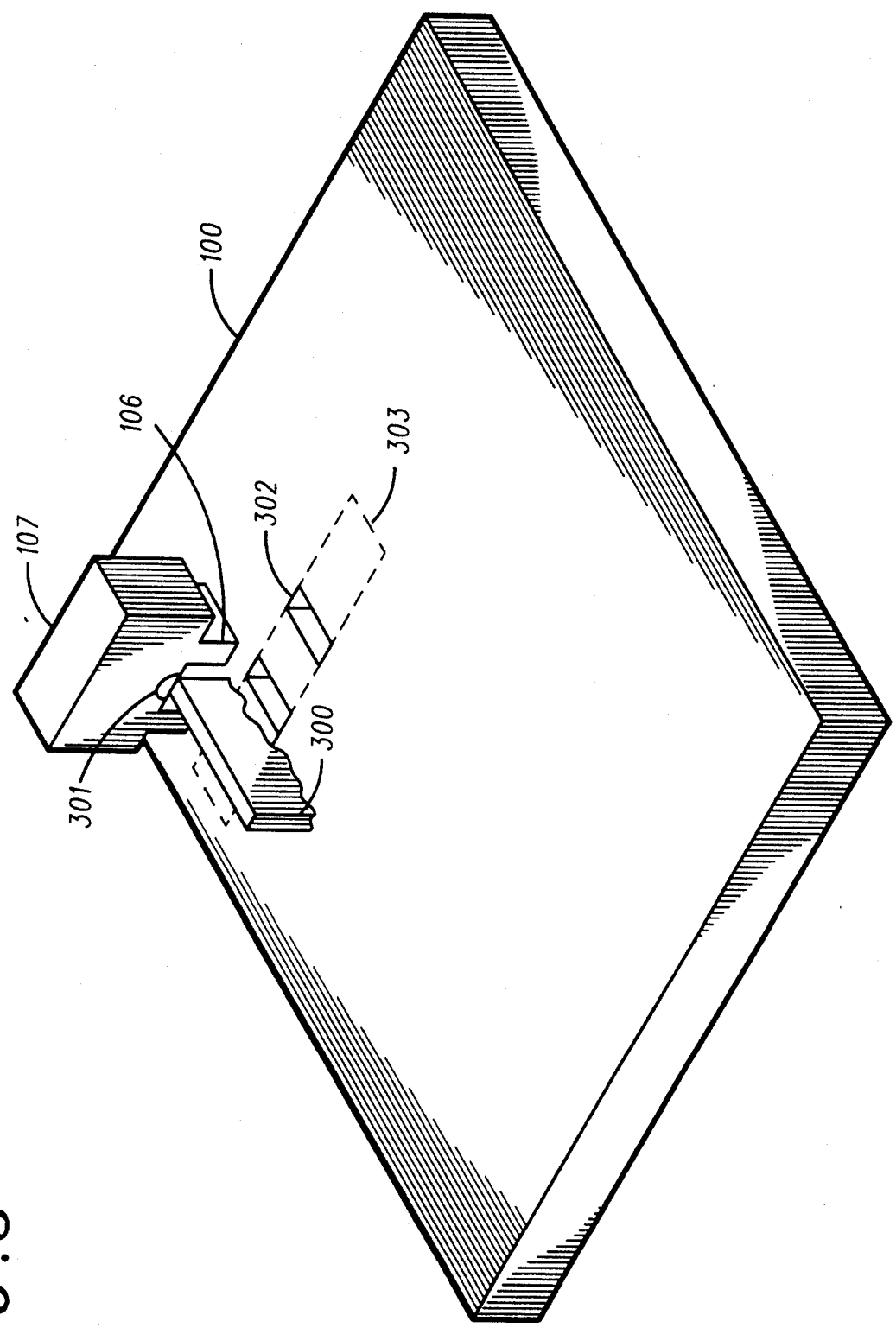
FIG. 3 illustrates an alternative embodiment for placing an RF shield onto a substrate.

FIG. 3 illustrates a perpendicular placement of RF shield 2 107 onto the substrate 100. The RF shield 2 107 further comprises a nonconductive area 301, as shown, a notch. Note that the nonconductive area 301 could be any means to prevent electrically coupling of the conductive plating on the RF shield with a trace on the component layout 103. The substrate 100 further comprises mounting holes 302 and an unresisted area 303. The tab 106 are inserted into the mounting holes 302 and, at least, is soldered on the opposite side of the substrate to adhere it to the substrate. The unresisted area 303 is designed in such a way that promotes adhering (i.e. wave or reflow soldering) of the RF shields 107 to the plating on the nonconductive substrate 100.

Figure 4:
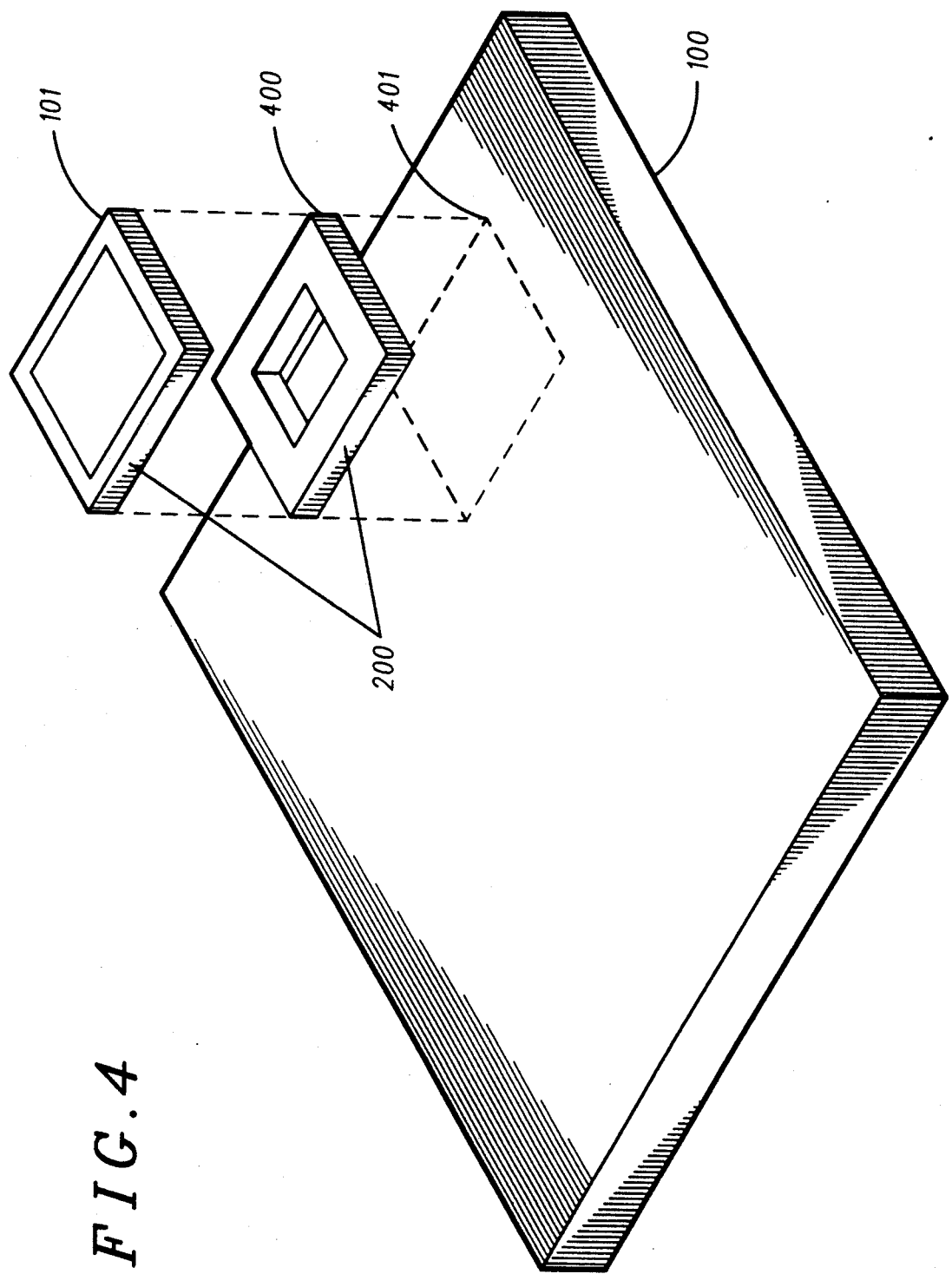
FIG. 4 illustrates another alternative embodiment for placing an RF shield onto a substrate.

FIG. 4 illustrates an alternate placement of RF shield 1 101 onto the substrate 100. This placement technique further comprises an intermediate layer 400 of laminated substrate material with edge plating 200. The intermediate layer 40 may be fabricated in the same manner and on the same substrate as the RF shields. The intermediate layer 400 provides means for shielding a particular area of the PC board that comprises components 401. To accomplish this, RF shield 1 101 and the intermediate layer 400 are placed parallel to the substrate 100 in a predetermined location.

Having fabricated the RF shields on the substrate they can now be placed on the substrate in a predetermined location. Placement of the RF shields onto the substrate can be manually placed or robotically placed utilizing standard vacuum autoplacement equipment to place the part thus eliminating the manual placement operation. The RF shield may be placed robotically because it is constructed from common laminate material. Recall that metallic RF shields are too heavy to be vacuum placed. This permits the use of standard surface mounted electrical components vacuum autoplacement equipment. After placing an RF shield, it can be attached to the substrate using a wave solder process, vapor phase solder process or an infrared solder reflow process.

We claim:

1. An RF shield apparatus comprising:

at least one nonconductive substrate having a predetermined conductive layout for electronic component coupling;

at least one predetermined geometric conductive shield fabricated from the at least one substrate; and nonconductive material adhered to at least one major surface of the at least one predetermined geometric conductive shield;

such that the predetermined layout and the at least one predetermined geometric conductive shield are fabricated substantially simultaneously on the nonconductive substrate.

2. In the RF shield apparatus of claim 1, the predetermined geometric conductive shield further comprises placement tabs such that the RF shield apparatus, when mounted to a substrate, is mounted substantially perpendicular to the substrate.

3. The RF shield apparatus of claim 1 further comprises a nonconductive area such that, when the RF shield is mounted to the substrate, a portion of the predetermined conductive layout substantially physically contacts the RF shield without electrical coupling.

4. A method for fabricating and adhering at least one RF conductive shield to a nonconductive substrate, the method comprises the steps of:

a) fabricating, in a predetermined geometric shape, the at least one RF conductive shield on the nonconductive substrate;

b) cutting the at least one RF conductive shield from the nonconductive substrate to produce at least one separate RF shield;

c) placing each of the at least one separate RF shield on the nonconductive substrate in a predetermined location; and d) adhering each of the at least one separate RF shield to the nonconductive substrate in the predetermined location.

5. In the method of claim 4, the fabrication of step (a) further comprises plating the at least one RF conductive shield with a conductive material.

6. The method of claim 5 further comprises applying, over a substantial portion of a major surface of the at least one RF conductive shield, a nonconductive layer that insulates the at least one RF conductive shield.

7. In the method of claim 5, the fabrication of step (a) further comprises plating edges of the at least one RF conductive shield with a conductive material.

8. In the method of claim 4, the placement of step (c) further comprises placing the at least one RF conductive shield with a vacuum placement device.

* * * * *